United States Patent
Freeman et al.

(10) Patent No.: US 6,395,448 B1
(45) Date of Patent: May 28, 2002

(54) EVAPORATED LUBRICANTS FOR IMAGING ELEMENT

(76) Inventors: Dennis R. Freeman; Christine J. Landry-Coltrain, both of Eastman Kodak Company 343 State St., Rochester, NY (US) 14650

( * ) Notice: Subject to any disclaimer, the term of this patent is extended or adjusted under 35 U.S.C. 154(b) by 0 days.

(21) Appl. No.: 09/452,358

(22) Filed: Dec. 1, 1999

(51) Int. Cl.$^7$ .......................... G03C 1/76; G03C 11/06; G03C 8/52; C23C 16/00; B41M 5/24
(52) U.S. Cl. .................. 430/201; 430/338; 430/523; 430/527; 430/530; 430/531; 430/536; 430/935; 430/961; 427/255.5; 427/255.23; 347/105; 503/227
(58) Field of Search ................ 430/523, 531, 430/536, 935, 961, 530, 201, 527, 338; 503/227; 347/105; 427/255.5, 255.23

(56) References Cited

U.S. PATENT DOCUMENTS

| | | | | |
|---|---|---|---|---|
| 4,863,762 A | * | 9/1989 | Aramaki et al. | 427/255.6 |
| 5,147,768 A | | 9/1992 | Sakakibara | 430/523 |
| 5,217,804 A | | 6/1993 | James et al. | 428/329 |
| 5,252,444 A | | 10/1993 | Yamada et al. | 430/503 |
| 5,432,050 A | | 7/1995 | James et al. | 430/523 |
| 5,807,661 A | * | 9/1998 | Landry-Coltrain | 430/523 |

FOREIGN PATENT DOCUMENTS

JP       1251349 A      10/1989

OTHER PUBLICATIONS

*Research Disclosure*, vol. 176, Dec. 10, 1978, Item 17643.
*Research Disclosure*, vol. 365, Sep. 10, 1994, Item 36544.

* cited by examiner

*Primary Examiner*—Richard L. Schilling
(74) *Attorney, Agent, or Firm*—Doreen M. Wells

(57) ABSTRACT

The present invention is a method of depositing a lubricating layer on an imaging element. The method includes providing a polymer or a wax selected from the group consisting of polytetrafluoroethylene (PTFE), fluorinated ethylene propylene (FEP), fluorinated ethylene copolymers, polyethylenes, high density polyethylene, natural waxes such as Carnauba wax, synthetic waxes, and silicone waxes in a deposition chamber. The chamber is evacuated to a pressure of $10^{-1}$ Torr or less. A carrier gas, preferably selected from $N_2$, $O_2$, Ar, is bled into the chamber while maintaining the pressure in the chamber to 100 mTorr or less. The polymer or wax is heated to a temperature sufficient to vaporize the polymer or wax, and the imaging element is continuously moved through the chamber depositing the polymer or wax on the imaging element to form the lubricating layer.

19 Claims, No Drawings

EVAPORATED LUBRICANTS FOR IMAGING ELEMENT

CROSS REFERENCE TO RELATED APPLICATIONS

This application relates to commonly assigned application Ser. No. 09/452,356 filed simultaneously herewith now U.S. Pat. No. 6,228,570.

FIELD OF THE INVENTION

The present invention is a method to provide a lubricant layer to an imaging element. More particularly the present invention eliminates the use of solvent in applying the lubricant layer to an imaging element.

BACKGROUND OF THE INVENTION

Photographic and image or information recording media require adequate lubrication for the purposes of transport through recording devices and imaging devices (camera, photofinishing, thermal head, etc.), and for scratch protection. Also, backing layers on photographic negative film that can be used to magnetically record, and subsequently, to retrieve, information require excellent lubrication at their surface to improve the durability of the recording layer. Contact between the magnetic head and the outermost surface of the backing layers of the film is necessary, however, this imposes a great amount of stress to the backing layers and may result in rupture of the layer, and in loss of signal. Good lubrication allows for multiple transports of the film through various magnetic head-containing equipment. The lubricant must also remain effective after the film has been run through photographic processing solutions.

Polyethylenes, silicone waxes, natural waxes such as Carnauba, polytetrafluoroethylene (PTFE), and fluorinated ethylene propylene (FEP) are known to be lubricating agents. Some are not soluble, some are soluble in limited solvents which impose constraints and difficulties for the coating of these lubricants and on manufacturing. In addition, the solvents used as vehicles for the wax may attack or cause damage or undesirable changes in the surface of the layer or layers onto which the lubricant is being coated. In addition, these carrier solvents may not be environmentally friendly.

Imaging elements containing transparent magnetic oxide coatings on the side opposite the imaging emulsions have been well-documented. The need for lubricating layers on said magnetic oxide coatings have also been well-described. A variety of types of lubricants have been disclosed including fatty acids, fatty acid esters, silicones, waxes, etc. In general, the transparent magnetic layer and the lubricating layer are applied in separate coating steps. This reduces the manufacturing efficiency of the product by requiring several coating stations. Typically these layers have been applied by first coating a solution of the magnetic oxide layer onto a support using a bead coating technique. The coating is then dried and a lubricant layer is then coated over the magnetic layer using a similar technique. Thus, another disadvantage is that the lubricant containing layer is typically applied using a solvent as a carrier, thus, generating solvent and solvent vapor waste.

Alternatively, the lubricant can be added to the magnetic oxide coating solution such that both the magnetics and lubricant are coated simultaneously. This is advantageous because less coating stations are required, likely reducing waste and simplifying the production. Unfortunately, in order for the lubricant to be effective it must primarily reside at the uppermost surface of the dry coating. When the lubricant is added to the magnetic oxide solution, it is difficult for the lubricant to get to the surface. As the solution dries rapidly, the polymeric binder for the magnetic oxide will vitrify or solidify, which retards the mobility of the lubricant. Additionally, the lubricant may also go to the support/magnetics interface instead of the desired magnetics/air interface. The result is an improperly lubricated surface, or a coating with a high coefficient of friction.

Another drawback of adding the lubricant directly to the magnetics layer is that phase separation can occur resulting in a translucent or opaque film. The lubricant can destabilize the magnetics dispersion, resulting in flocculation of the particles. Also, the lubricant may not be compatible with the magnetics binder, which can lead to gross phase separation and loss of optical transparency. It is desired to have the lubricant phase separate and migrate to the air interface, without the loss of optical transparency. Obviously a very selective phase separation is desired and is difficult to control. Alternatively, the lubricant may not be soluble, or dispersible in the same solvents as are needed for the components of the transparent magnetic layer.

Japanese Patent1251349 A (New Nippon Electric Co) discusses a magneto-optical recording medium that comprises an optically transparent substrate onto which a magnetic film is formed. A macromolecular film formed by plasma polymerization of tetrafluoroethylene monomer is formed on the surface-side dielectric substance film. Vacuum deposition of PTFE-like substances involve starting with gaseous monomers and doing a plasma polymerization. The present invention offers the advantage that the original lubricant materials are preformed polymers as opposed to monomers such as tetrafluoroethylene, thus avoiding complex handling of often toxic gases. In addition, exposing the surface to the plasma can degrade the magnetic and underlying layers and compromise the coefficient of friction, the durability, and the abrasion resistance of the element.

U.S. Pat. No. 4,863,762 describes a physical vapor deposition technique that deposits fluororesins onto a surface. However, in this process, there is a need to degrade the molecular weight of the initial resin sample prior to the vacuum deposition process. This is done by heating the resin in the presence of a fluorine source. U.S. Pat. No. 4,390,601 describes the vacuum deposition of a lubricant onto a (non-transparent) magnetic substrate. The lubricants described are paraffins, fatty-acids and soaps, which are not the subject of the present application. The deposition process described is for a stationary substrate, not a moving web.

What is needed in the art is a method that does not require solvents, does not require a solvent coating machine, and also ensures that the lubricant remains at the outermost surface of the transparent magnetic layer. Thus a manufacturing advantage would be obtained since a solvent coating machine would not be required for the application of this lubricant, which offers capacity advantages. Also, environmental benefits would be obtained due to the elimination of solvent waste and evaporation. A minimal amount of lubricant would be deposited by this method, so that lube transfer to the head would be minimized and head clogging problems reduced.

SUMMARY OF THE INVENTION

The present invention describes a means of obtaining a lubricated layer on an imaging element via deposition of the lubricant onto a dried magnetic layer via an evaporative process. The method includes providing a polymer or a wax selected from the group consisting of polytetrafluoroethylene (PTFE), fluorinated ethylene propylene (FEP), fluorinated ethylene copolymers, polyethylenes, high density polyethylene, natural waxes such as Carnauba wax, synthetic waxes, and silicone waxes in a deposition chamber. The chamber is evacuated to a pressure of $10^{-1}$ Torr or less A carrier gas is bled into the chamber while maintaining the pressure in the chamber to 100 mTorr or less. Preferred gases are selected from the group consisting of $N_2$, $O_2$, and Ar. The polymer or wax is heated to a temperature sufficient to vaporize the polymer or wax, and the imaging element is moved through the chamber on a continuously moving web, depositing the polymer or wax on the imaging element to form the lubricating layer.

The present invention provides low coefficient of friction and, in addition, provides durability for excellent performance under a magnetic head. The lubricant layer is transparent and does not interfere with the transmission of light through the imaging element.

DETAILED DESCRIPTION OF THE INVENTION

A support, coated with appropriate layers (e.g. subbing, antistat, and transparent magnetic oxide layers) on the side opposite to the emulsion layers, is exposed, under vacuum, to a lubricant vapor phase. The lubricant vapor phase is obtained by heating the material to high enough temperatures to produce evaporation, or partial chemical breakdown, followed by evaporation. An appropriate background gas (such as argon, nitrogen, oxygen, etc.) is used to maintain a controlled atmosphere for the lubricant vapor phase to pass through as it deposits on the web. The side of the support that is coated with the vaporized lubricant is the side opposite to the emulsion layers.

Typical conditions for the deposition of the lubricant are a pressure of between 10–1000 mT, preferably 100 mT and a temperature within the range of 300° C. to 660° C. The support continuously moves through the chamber at a speed of between 1 and 1000 feet per minute. The temperature of evaporation that is chosen depends on the melting point of the lubricant and on the speed of the moving support. Any carrier gas can be used, most typical gases are Nitrogen, Argon, or Oxygen.

Any typical wax or known solid or waxy lubricant can be used for this invention. In particular, typical lubricants include polyethylenes, high density polyethylene, silicone waxes, natural waxes such as Carnauba, synthetic waxes, polytetrafluoroethylene, fluorinated ethylene propylene, and fluorinated ethylene copolymers.

The base support for the present invention can be cellulose derivatives such as a cellulose ester, cellulose triacetate, cellulose diacetate, cellulose acetate propionate, cellulose acetate butyrate, polyesters, such as polyethylene terephthalate or polyethylene naphthalate, poly-1,4-cyclohexanedimethylene terephthalate, polybutylene terephthalate, and copolymers thereof, polyimides, polyamides, polycarbonates, polystyrene, polyolefins, such as polyethylene, polypropylene, polysulfones, polyarylates, polyether imides and blends of these. The support typically employs an undercoat or a subbing layer well known in the art that comprises, for example, for a polyester support a vinylidene chloride/methyl acrylate/itaconic acid terpolymer or a vinylidene chloride/acrylonitrile/acrylic acid terpolymer.

The imaging elements according to this invention can contain one or more conducting layers such as antistatic layers and/or antihalation layers such as described in *Research Disclosure,* Vol. 176, December 1978, Item 17643 to prevent undesirable static discharges during manufacture, exposure and processing of the photographic clement. Antistatic layers conventionally used for color films have been found to be satisfactory herewith. Any of the antistatic agents set forth in U.S. Pat. No. 5,147,768 which is incorporated herein by reference may be employed. Preferred antistatic agents include metal oxides, for example tin oxide, antimony doped tin oxide and vanadium pentoxide. These antistatic agents are preferably dispersed in a film forming binder.

The magnetic particles in the transparent magnetic layer can be ferromagnetic iron oxides, such as $\gamma$-$Fe_2O_3$, $\gamma$-$Fe_3O_4$, $\gamma$-$Fe_2O_3$ or $Fe_3O_4$ with Co, Zn or other metals in solid solution or surface treated or ferromagnetic chromium dioxides, such as $CrO_2$ with metallic elements, for example Li, Na, Sn, Pb, Fe, Co, Ni, and Zn, or halogen atoms in solid solution. Ferromagnetic pigments with an oxide coating on their surfaces to improve their chemical stability or dispersability, as is commonly used in conventional magnetic recording, may also be used. In addition, magnetic oxides with a thicker layer of lower refractive index oxide or other material having a lower optical scattering cross-section as taught in U.S. Pat. Nos. 5,217,804 and 5,252,444 can be used. These are present in the transparent magnetic layer in the amount from about 1 to 10 weight percent based on the weight of the binder. The magnetic particles have a surface area greater than 30 $m^2$/gm and a coverage of from about $1*10^{-11}$ mg/$\mu m^3$ to $1*10^{-10}$ mg/$\mu m^3$. A dispersing agent, or wetting agent can be present to facilitate the dispersion of the magnetic particles. This helps to minimize the agglomeration of the magnetic particles. Useful dispersing agents include fatty acid amines and commercially available wetting agents such as Witco Emcol™ CC59 which is a quaternary amine available from Witco Chemical Corp. Rhodafac™ PE 510, Rhodafac™ RE 610, Rhodafac™ RE960, and Rhodafac™ LO0529, which are phosphoric acid esters available from Rhone-Poulenc.

The polymer binder of the transparent magnetic layer may be any polymer having good abrasion resistance. For example, cellulose esters such as cellulose diacetates and triacetatos, cellulose acetate propionate, cellulose acetate butyratc, cellulose nitrate, polyacrylates such as polymethyl methacrylate, polyphenylmethacrylate and copolymers with acrylic or methacrylic acid, or sulfonates, polyesters, polyurethanes, urea resins, melamine resins, urea-formaldehyde resins, polyacetals, polybutyrals, polyvinyl alcohol, epoxies and epoxy acrylates, phenoxy resins, polycarbonates, vinyl chloridc-vinyl acetate copolymers, vinyl chloride-vinyl acetate-vinyl-alcohol copolymers, vinyl chloride-vinyl acetate-maleic acid polymers, vinyl chloride-vinylidene chloride copolymers, vinyl chloride-acrylonitrile copolymers, acrylic ester-acrylonitrile copolymers, acrylic ester-vinylidene chloride copolymers, methacrylic ester-styrene copolymers, butadiene-acrylonitrile copolymers, acrylonitrile-butadiene-acrylic or methacrylic acid copolymers, styrene-butadiene copolymers can be used as binders in the transparent magnetic layer. Cellulose ester derivatives, such as cellulose diacetates and triacetates, cellulose acetate propionate, cellulose nitrate, polyesters, and polyacrylates such as polymethyl methacrylate, polyphenylmethacrylate and copolymers with acrylic or methacrylic acid are preferred.

Abrasive particles useful in the magnetic layer include nonmagnetic inorganic powders with a Mohs scale hardness of not less than 6. These include, for example, metal oxides such as alpha-alumina, chromium oxide ($Cr_2O_3$), alpha-$Fe_2O_3$, silicon dioxide, alumino-silicate and titanium dioxide. Carbides such as silicone carbide and titanium carbide, nitrides such as silicon nitride, titanium nitride and diamond in fine powder may also be used. Alpha alumina and silicon dioxide are preferred. These are included to improve the head cleaning properties and improve durability of the coating. A dispersing agent, or wetting agent can be present to facilitate the dispersion of the abrasive particles. This helps to minimize the agglomeration of the particles. Useful dispersing agents include, but are not limited to, fatty acid amines and commercially available wetting agents such as Solsperse™ 24000 sold by Zeneca, Inc. (ICI). The abrasive particles have a median diameter of about 0.2 to 0.4 µm. The abrasive particles are present in the magnetic layer in die amount of at least 2 weight percent based on the weight of the binder so that durability of the coating is achieved and clogging of the magnetic heads is prevented. The upper limit of the amount of abrasive particles is determined by the loss of transparency of the layer, adversely affecting the photographic element, and by their abrasive effects on the magnetic heads and the tools and photographic apparatus that the film comes in contact with, leading to premature wear of these tools and apparatus. Typically, the abrasive particles are present in the transparent magnetic layer in the amount of 2 wt % to about 20 wt % relative to the weight of the binder.

Filler particles useful in the magnetic layer have a median diameter less than 0.15 µm, preferably less than 0.1 µm. The filler particles have a Mohs hardness greater than 6 and are present in the amount from about 0 to 300 percent, most preferably in the amount from about 0 to 85 percent based on the weight of the binder. Examples of filler particles include nonmagnetic inorganic powders such as δ-aluminum oxide, chromium oxide, iron oxide, tin oxide, doped tin oxide, silicon dioxide, alumino-silicate, titanium dioxide, silicon carbide, titanium carbide, and diamond in fine powder, as described in U.S. Pat. No. 5,432,050. A dispersing agent, or wetting agent can be present to facilitate the dispersion of the filler particles. This helps to minimize the agglomeration of the particles. Useful dispersing agents include, but are not limited to, fatty acid amines and commercially available wetting agents such as Solsperse™ 24000 sold by Zeneca, Inc. (ICI). Preferred filler particles are gamma-aluminum oxide and silicon dioxide.

The transparent magnetic layer may include coating aids and surfactants such as nonionic fluorinated alkyl esters such as FC-430, FC-431, FC-10, FC171 sold by Minnesota Mining and Manufacturing Co., Zonyl fluorochemicals such as Zonyl-FSN™, Zonyl-FTS™, Zonyl-TBS™, ZonylBA™ sold by DuPont; polysiloxanes such as Dow Coming DC 1248, DC200, DC510, DC 190 and BYK 320, BYK 322, sold by BYK Chemic and SF 1079, SF1023, SF 1054, and SF 1080 sold by General Electric; polyoxyethylene-lauryl ether surfactants sold by Kodak; sorbitan laurate, palmitate and stearates such as Span surfactants sold by Aldrich.

Viscosity modifiers can be present in the transparent magnetic layer. Such viscosity modifiers include high molecular weight cellulose esters, cellulosics, acrylics, urethanes, and polyethylene oxides.

Solvents useful for coating the transparent magnetic layer of the present invention include alcohols, ketones, acetates, chlorinated solvents, esters, water, hydrocarbons, ethers, or mixtures thereof.

In an embodiment of this invention, the imaging element is a thermal dye diffusion receiving element that can be transparent or opaque. In another embodiment of this invention, the imaging element is a thermal dye diffusion dye donor element. In another embodiment of this invention, the imaging element is an inkjet ink receiving element that can be transparent or opaque.

In a particularly preferred embodiment, the imaging elements of this invention are photographic elements, such as photographic films, photographic papers or photographic glass plates, in which the image-forming layer is a radiation-sensitive silver halide emulsion layer. Such emulsion layers typically comprise a film-forming hydrophilic colloid. The most commonly used of these is gelatin and gelatin is a particularly preferred material for use in this invention. Useful gelatins include alkali-treated gelatin (cattle bone or hide gelatin), acid-treated gelatin (pigskin gelatin) and gelatin derivatives such as acetylated gelatin, phthalated gelatin and the like. Other hydrophilic colloids that can be utilized alone or in combination with gelatin include dextran, gum arabic, zein, casein, pectin, collagen derivatives, collodion, agar-agar, arrowroot albumin, and the like. Still other useful hydrophilic colloids are water-soluble polyvinyl compounds such as polyvinyl alcohol, polyacrylamide, poly (vinylpyrrolidone), and the like.

The photographic elements of the present invention can be simple black-and-white or monochrome elements comprising a support bearing a layer of light-sensitive silver halide emulsion or they can be multilayer and/or multicolor elements.

Color photographic elements of this invention typically contain dye image-forming units sensitive to each of the three primary regions of the spectrum. Each unit can be comprised of a single silver halide emulsion layer or of multiple emulsion layers sensitive to a given region of the spectrum. The layers of the element, including the layers of the image-forming units, can be arranged in various orders as is well known in the art.

A preferred photographic element according to this invention comprises a support bearing at least one blue-sensitive silver halide emulsion layer having associated therewith a yellow image dye-providing material, at least one green-sensitive silver halide emulsion layer having associated therewith a magenta image dye-providing material and at least one red-sensitive silver halide emulsion layer having associated therewith a cyan image dye-providing material.

In addition to emulsion layers, the photographic elements of the present invention can contain one or more auxiliary layers conventional in photographic elements, such as overcoat layers, spacer layers, filter layers, interlayers, antihalation layers, pH lowering layers (sometimes referred to as acid layers and neutralizing layers), timing layers, opaque reflecting layers, opaque light-absorbing layers and the like. The support can be any suitable support used with photographic elements. Typical supports include polymeric films, paper (including polymer-coated paper), glass and the like. Details regarding supports and other layers of the photographic elements of this invention are contained in *Research Disclosure*, Item 36544, September, 1994.

The light-sensitive silver halide emulsions employed in the photographic elements of this invention can include coarse, regular or fine grain silver halide crystals or mixtures thereof and can be comprised of such silver halides as silver chloride, silver bromide, silver bromoiodide, silver chlorobromide, silver chloroiodide, silver chorobromoiodide, and mixtures thereof. The emulsions can be, for example, tabular grain light-sensitive silver halide emulsions. The emulsions can be negative working or direct positive emulsions. They can form latent images predominantly on the surface of the silver halide grains or in the interior of the silver halide grains. They can be chemically and spectrally sensitized in accordance with usual practices. The emulsions typically will be gelatin emulsions although other hydrophilic colloids can be used in accordance with usual practice. Details regarding the silver halide emulsions are contained in *Research Disclosure*, Item 36544, September, 1994, and the references listed therein.

The photographic silver halide emulsions utilized in this invention can contain other addenda conventional in the photographic art. Useful addenda are described, for example, in *Research Disclosure*, Item 36544, September, 1994. Useful addenda include spectral sensitizing dyes, desensitizers, antifoggants, masking couplers, DIR couplers, DIR compounds, antistain agents, image dye stabilizers, absorbing materials such as filter dyes and UV absorbers, light-scattering materials, coating aids, plasticizers and lubricants, and the like.

Depending upon the dye-image-providing material employed in the photographic clement, it can be incorporated in the silver halide emulsion layer or in a separate layer associated with the emulsion layer. The dye-image-providing material can be any of a number known in the art, such as dye-forming couplers, bleachable dyes, dye developers and redox dye-releasers, and the particular one employed will depend on the nature of the clement, and the type of image desired.

Dye-image-providing materials employed with conventional color materials designed for processing with separate solutions are preferably dye-forming couplers; i.e., compounds which couple with oxidized developing agent to form a dye. Preferred couplers which form cyan dye images are phenols and naphthols. Preferred couplers which form magenta dye images arc pyrazolones and pyrazolotriazoles. Preferred couplers which form yellow dye images are benzoylacetanilides and pivalylacetanilides.

The present invention is illustrated by the following examples.

EXAMPLE 1

A transparent magnetic layer is prepared by coating solution A to a dry thickness of about 1.2 microns onto a support of subbed polyethylene naplithalate containing a vanadium pentoxide layer. The coating of solution A can be effected by any coating method knowvn in the art. Solution A is generated by dispersing the magnetic particles (CSF-4085V2) and abrasive particles (E-600) in their respective solvents and respective stabilizing agents and adding these with a high shear mixer to a cellulose diacetate/cellulose triacetate solution in methylene chloride/acetone/methyl acetoacetate solvent mixture. A coating aid (optional), either FC-430 or FC-431, (3M Corporation) is added with low shear mixing. The composition of solution A is indicated in Table I below.

TABLE I

Composition of solution A.

| Ingredient | Percent of Solution A |
|---|---|
| Cellulose diacetate [CA398-30] from Eastman Chemical Co. | 2.82 |
| Cellulose triacetate [CTA436-80S] from Eastman Chemical Co. | 0.125 |

TABLE I-continued

Composition of solution A.

| Ingredient | Percent of Solution A |
|---|---|
| Rhodafac ™ PE510 surfactant | 0.006 |
| CSF-4085V2 from Toda Kogyo | 0.12 |
| E-600 from Norton Chemical | 0.08 |
| Solsperse ™ 24000 dispersant from Zeneca, Inc (ICI), | 0.004 |
| FC-431 from 3M Corporation | 0.02 |
| Dibutyl phthalate | 0.25 |
| Methylene chloride | 67.61 |
| Acetone | 24.15 |
| Methyl acetoacetate | 4.82 |

The coating is dried at temperatures to effectively remove all the solvent from the layer.

The lubricant layer is then applied to the dried transparent magnetic layer (TML) as follows. The experimental set-up (in a vacuum chamber) uses a 13.56 MHz RF generator and tuning network. The power from the RF generator is connected to an aluminum cathode. The web (with the TML coating) is the anode. The aluminum cathode, positioned just down-stream of the boat, has either 1 inch diameter hole bored through its center, or a slit-lid (5 inch long×¼ inch wide slit). Below this hole or slit is a tantalum boat that contains the solid lubricant and has a ⅜ inch diameter hole or slot in its lid. The boat has a thermocouple attached to it and is resistance heated while the temperature is monitored and maintained. The temperature is maintained to cause the source material (lubricant) to reach its vapor phase. Thus vapor deposits on the transporting web (while optionally passing through a plasma). In some instances there is no plasma. After the experiment has been done, the treated/coated web is removed from the vacuum chamber and sections are cut out and tested.

FEP-1 solid powder lubricant was placed in the tantalum boat in the described apparatus and heated to a temperature of between 300 and 320° C. The web with the dried transparent magnetic layer (TML) facing the lubricant-containing boat was transported at a fixed speed of 3 feet per minute above the boat. The carrier gas was argon, at a pressure 30 mTorr.

The coefficient of friction (COF) of this final package was measured using standard known methods, such as those described in ASTM method designation: D 1894-78. For the practical purposes of the described invention either an IMASS Ball Sled friction tester or a paper clip friction tester. In the Ball Sled test, three tungsten balls are mounted in a triangular geometry onto a rigid support. The test sample is placed flat on another rigid support with the lubricious side of the sample facing upwards. The balls arc then brought into contact with the test specimen and the sled is mechanically driven and set into horizontal motion, so that the test specimen and the balls are moving relative to each other. The force needed to sustain movement of the two surfaces relative to each other is measured and is related to the coefficient of friction (COF). A friction value less than 0.35, preferably less than 0.26, is desirable. The Paper Clip Friction test utilizes a U-shaped frictional slider cut from a steel paper clip. The rounded part of the slider contacts the sample in this test. A ¾" by 6" piece ink of the sample to be evaluated is secured on the inclined plane of the device, the lubricated surface facing upward. The inclined plane is then raised to an arbitrarily chosen angle (θ) and the frictional slider is placed on the sample. The paper clip assembly produces a load of 63.2 cos θ grams perpendicular to the sample surface. If die paper clip continuously slides down the coated sample, the angle of the inclined plane is decreased until the paper clip does not slide. The lowest angle in which the paper clip slides continuously down the sample corresponds to a COF which is determined from a calibrated scale on the inclined plane. The smaller the angle needed for the paper clip to continuously slide on the coated sample, the lower the COF.

The durability of the coating was tested with a rotating drum friction tester (RDFT) where a narrow (½ in) strip of the sample is placed in contact with a 4" diameter stainless steel drum utilizing a 180° wrap angle. One end of the sample is fixed and a 50 g load is placed on tie other end of the sample. The lubricated side of the sample is in contact with the drum. The drum is rotated at 10.5"/sec arid the friction between the drum and the sample is measured for a 10 minute time period. Desired results are a very flat and low friction ($\mu f$) vs time curve for the duration of the test. The test is repeated on three different portions of the coating. Samples that "pass" will endure the entire test, maintaining a low friction. Samples that "fail" show increasing friction with time during the test. The latter indicates insufficient lubrication of the surface of the coating, or a coating with poor physical properties.

The dried transparent magnetic layer of Example 1 had a measured COF of 0.10 and passed the RDFT test, as indicated in Table II.

Table II lists the results for other examples that were prepared as in Example 1, differing only by the composition of the lubricant. Different carrier gases were evaluated and the pressure used was varied between 1 mTorr and 1 Torr. The transparent magnetic layer of Comparative example CE 18 was prepared as in Example 1, except that no lubricant layer was deposited onto it. The performance results are listed in Table II.

TABLE II

| | Lubricant | Carrier Gas | COF | RDFT |
|---|---|---|---|---|
| EX 1 | FEP-1 | Argon | 0.1 | pass |
| EX 2 | FEP-1 | Oxygen | 0.09 | pass |
| EX 3 | FEP-1 | Nitrogen | 0.09 | pass |
| EX 4 | FEP-2 | Nitrogen | 0.12 | pass |
| EX 5 | FEP-2 | Oxygen | 0.14 | pass |
| EX 6 | PTFE-1 | Argon | 0.1 | pass |
| EX 7 | PTFE-1 | Oxygen | 0.12 | pass |
| EX 8 | PTFE-1 | Nitrogen | 0.09 | pass |
| EX 9 | PTFE-2 | Oxygen | 0.12 | pass |
| EX 10 | PTFE-2 | Nitrogen | 0.23 | pass |
| EX 11 | Carnauba wax | Argon | 0.13 | pass |
| EX 12 | Carnauba wax | Oxygen | 0.11 | pass |
| EX 13 | Carnauba wax | Nitrogen | 0.12 | pass |
| EX 14 | HDPE | Oxygen | 0.15 | pass |
| EX 15 | HDPE | Nitrogen | 0.13 | pass |
| EX 16 | Silicone wax | Oxygen | 0.19 | pass |
| EX 17 | Silicone wax | Nitrogen | 0.23 | pass |
| CE 18 | none | none | >0.5 | fail |

FEP-1: Fluorinated ethylene propylene resin Grade FEP-T120 aqueous dispersion from DuPont; dried under vacuum to remove the water.

FEP-2: Fluorinated ethylene propylene resin Grade FEP100 pellets from DuPont.

PTFE-1: Polytetrafluoroethylene Grade Chemslip 42 aqueous dispersion from Chemical Corporation of America; dried under vacuum to remove the water.

PTFE-2: Polytetrafluoroethylene Grade 8A powder from DuPont.

Carnauba wax: Carnauba wax flakes from Acros Organics, NJ.

HDPE: High density polyethylene ME39235 aqueous emulsion from Michelman, Inc.; dried under vacuum to remove the water.

Silicone wax: Silicone wax copolymer EXP-58 from Genesee Polymers Corporation.

The invention has been described in detail with particular reference to certain preferred embodiments thereof, but it will be understood that variations and modifications can be effected within the spirit and scope of the invention.

What is claimed is:

1. A method of depositing a lubricating layer on an imaging element comprising:

providing in a deposition chamber a polymer or wax selected from the group consisting of polytetrafluorocthylene, fluorinated ethylene propylene, fluorinated ethylene copolymers, polyethylenes, natural waxes, synthetic waxes, and silicone waxes;

pressurizing the chamber to a pressure of $10^{-1}$ Torr or less;

bleeding a carrier gas into the chamber while maintaining the pressure in the chamber to 100 milli torr or less;

heating the polymer or wax to a temperature sufficient to vaporize the polymer or wax;

moving the imaging element through the chamber on a continuously moving web; and depositing the polymer or wax on the imaging element to form a lubricating layer.

2. A method of depositing a lubricating layer on an imaging element comprising:

providing in a deposition chamber a fluoropolymer resin;

pressurizing the chamber to a pressure of $10^{-1}$ Torr or less;

bleeding a carrier gas into the chamber while maintaining the pressure in the chamber to 100 milli torr or less;

heating the polymer to a temperature sufficient to vaporize the polymer;

moving the imaging element through the chamber on a continuously moving web; and depositing the polymer on the imaging element to form a lubricating layer.

3. The method of claim 1 wherein the natural waxes include Carnauba wax.

4. The method of claim 1 wherein the polymer is a high density polyethylene.

5. The method of claim 1 wherein the polymer or wax is heated within a range of 300° C. and 660° C.

6. The method of claim 1 wherein the gas in the deposition chamber is selected from Argon, Nitrogen and Oxygen.

7. The method of claim 1 wherein the imaging element comprises a support;

an image forming layer on the support; and optional layers selected from subbing, antistat, and transparent magnetic oxide layers.

8. The method of claim 7 wherein the lubricating layer is formed on the side of the support opposite the image forming layer.

9. The method of claim 7 wherein the element is a photographic element, the image forming layer is an emulsion layer and the lubricating layer is formed on the side of the support opposite the emulsion layer.

10. The method of claim 7 wherein the antistat layer includes metal oxides.

11. The method of claim 10 wherein the metal oxide is selected from fin oxide, antimony doped with tin oxide and vanadium pentoxide.

12. The method of claim 7 wherein the transparent magnetic layer contains magnetic particles.

13. The method of claim 12 wherein the magnetic particles have a surface area greater than 30 m2/gm.

14. The method of claim 12 wherein the magnetic particles are present in the transparent magnetic layer in an amount between 1 and 10 weight percent based on the weight a binder present in the magnetic layer.

15. The method of claim 1 wherein the wax is silicone wax.

16. The method according to claim 1 or 7 wherein the element is an inkjet receiver.

17. The method according to claim 1 or 7 wherein the element is a thermal dye diffusion receiver.

18. The method according to claim 1 or 7 wherein the element is a thermal dye diffusion dye donor.

19. The method of claim 2 wherein the polymer is a fluorinated polymer selected from the group consisting of polytetrafluoroethylene, fluorinated ethylene propylene, perfluoroalkoxy copolymer resins, and amorphous fluoropolymers.

* * * * *